United States Patent
Tseng et al.

(10) Patent No.: US 6,405,359 B1
(45) Date of Patent: Jun. 11, 2002

(54) METHOD FOR BACKSIDE FAILURE ANALYSIS REQUIRING SIMPLE BIAS CONDITIONS

(75) Inventors: Fouriers Tseng, Chu-tone; Thomas Hung, Shin-Chu, both of (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/412,206

(22) Filed: Oct. 5, 1999

(51) Int. Cl.[7] .............................................. G06F 17/50
(52) U.S. Cl. ...................................................... 716/21
(58) Field of Search ........................ 716/2, 14, 19–21; 438/14, 15

(56) References Cited

U.S. PATENT DOCUMENTS 6,072,323 A * 6/2000 Hembree ........................ 716/4
6,140,826 A * 10/2000 Jeng ............................. 716/21

* cited by examiner

Primary Examiner—Matthew Smith
Assistant Examiner—Thuan Do
(74) Attorney, Agent, or Firm—Randy W. Tung

(57) ABSTRACT

A method for conducting backside failure analysis on a wafer that only requires simple bias conditions to be fed into defective IC dies and a wafer test specimen which enables such test are disclosed. In the method, a wafer can be first provided that contains at least one defective IC die in an active (or front) surface, at least two conductive metal strips formed of a metal foil are then adhesively bonded to the active surface of the wafer juxtaposed to the at least one defective IC die. At least two lead wires are then bonded by a wire bonding technique between the at least two conductive metal strips and at least two bond pads on the defective IC die for establishing electrical communication therein between. A bias voltage such as a VCC signal or a clock signal can then be fed to the defective IC die through the at least two conductive metal strips, while the defect being observed from the backside of the wafer with an optical detector. The present invention novel method and the wafer test specimen enable the method to be executed at a relatively low cost and a shortened analysis time since a complete wafer can be tested without first been severed and packaged into IC chips as normally required in conventional test methods. Furthermore, the present invention novel test method can be executed on selected defective IC dies on a wafer without disturbing, or damaging other good dies.

20 Claims, 2 Drawing Sheets

METHOD FOR BACKSIDE FAILURE ANALYSIS REQUIRING SIMPLE BIAS CONDITIONS

FIELD OF THE INVENTION

The present invention generally relates to a method for conducting backside failure analysis on a wafer that requires simple bias conditions and a wafer specimen for conducting such analysis and more particularly, relates to a method for conducting backside failure analysis on a wafer that requires simple bias conditions by adhering metal foils to the surface of the wafer and connecting by wire bonding to bond pads on the wafer surface for feeding a bias voltage to a defective IC die and observing a defect from the backside of the wafer and a wafer test specimen for conducting such backside failure analysis.

BACKGROUND OF THE INVENTION

In the semiconductor fabrication technology, the capability and effectiveness of performing a failure analysis on a semiconductor chip package are very important. When an integrated circuit (IC) chip fails in service, the nature and the cause for such failure must be determined in order to prevent the reoccurrence of such failure in similar products.

An IC chip is normally built on a silicon base substrate with many layers of insulating materials and metal interconnections. This type of multi-layer structure becomes more important in modem IC devices such as high density memory chips where, in order to save chip real estate, the active device is built upwards in many layers forming transistors, capacitors and other logic components.

When an IC device is found defective during a quality control test, various failure analysis techniques can be used to determine the cause of such failure. Two of the more recently developed techniques for performing failure analysis are the infrared light emission microscopy and the light-induced voltage alteration (LIVA) imaging technique. In the infrared light emission light analysis, an infrared light transmitted through a substrate silicon material is used to observe from the backside of an IC the failure mode of the circuit. For instance, at a magnification ratio of 100x, a failure point in the circuitry can be located. The LIVA imaging technique can be used to locate open-circuited and damaged junctions and to image transistor logic states. The LIVA images are produced by monitoring the voltage fluctuation of a constant current power supply when a laser beam is scanned over an IC. A high selectivity for locating defects is possible with the LIVA technique.

Another method that has become more common in failure analysis of IC chips is the scanning optical microscopy (SOM). The high focusing capability of SOM provides improved image resolution and depth comparable to conventional optical microscopy. It is a useful tool based on the laser beam's interaction with the IC. The SOM technique enables the localization of photocurrents to produce optical beam induced current image that show junction regions and transistor logic states. Several major benefits are made possible by the SOM method when compared to a conventional scanning electron microscopy analysis. For instance, the benefits include the relative ease of making IC electrical connection, the no longer required vacuum system and the absence of ionizing radiation effects.

Even though the above discussed techniques arc effective in identifying failure modes in IC circuits, the techniques require elaborate and complicated electronic equipment which are generally costly and not readily available in a semiconductor fabrication facility. It is therefore desirable to have available a method and apparatus that can be easily carried out without expensive laboratory equipment such that the apparatus can be installed in any fabrication facilities. One such apparatus utilizes a liquid crystal coating layer for the identification of failure sites in an IC chip. For instance, in the method wherein a liquid crystal layer is used for the identification of failure sites, a liquid crystal material is frequently coated on top of an IC chip or an IC package. A typical test set up is shown in FIG. 1.

As shown in FIG. 1, a typical liquid crystal detection apparatus 10 is provided. The apparatus 10 generally includes a heater 12 and an optical microscope 14. On a top surface 16 of the heater 12, an IC package 20 is positioned under the microscope 14. The IC package 20 may be a plastic quad flat pack (PQFP) or any other packaged IC device. The IC package 20, shown in FIG. 1, is completed with bonding pads 22 and bonding wires 24. In the middle portion of the package 20 are IC circuits that contain failure sites need to be identified by a liquid crystal method. In the conventional method, a liquid crystal material is first coated to the top surface 26 of the IC package 20. The IC package 20 is then positioned on top of the heater 12 which can be heated at a pre-programmed heating rate to a specific temperature. The IC package 20, together with the coated liquid crystal layer (not shown) is normally heated to a temperature just below the clear/opaque transition temperature of the liquid crystal material. For instance, a suitable temperature would be approximately between about 5° and about 10° below the transition temperature of the liquid crystal. After the IC package 20 is heated to the predetermined temperature, a pre-selected voltage is applied to the IC circuit through bonding wires 24. The IC circuit, upon receiving such a voltage, heats up at any short or leakage positions. A hot spot is thus generated at each of the locations. The liquid crystal material immediately adjacent, or contacting the hot spots has its temperature raised above its transition temperature and transforms from an opaque state to a clear state. As a result, bright spots in the liquid crystal layer, i.e., on the IC package, show up to indicate the failure sites in the package.

Several drawbacks have been noted in the practice of the liquid crystal detection method. One of the obvious drawbacks is that when testing IC chips of different sizes, a single test board cannot be used for all IC chips. A different test board is required for testing chips of different sizes such that the chip can be mounted on the board for making electrical connections by wire bonding with the conductive leads provided on the test board. Based on the large number of IC chips of different sizes it is a tedious task to supply a large number of test boards that will fit each individual chip. Ideally, a universal test board should be designed such that it will fit different sizes of IC chips for testing.

Regardless which one of the failure analysis techniques is adopted, an IC chip package must be properly prepared with a suitable surface for performing a failure analysis. Since most modem IC chips utilizes at least two or more layers of metal thin films as interconnect layers, the active components of the chip on which the failure analysis is to be performed are usually shielded by the metal interconnect layers. Great difficulties are encountered in performing any of the failure analysis techniques, i.e., the infrared light emission microscopy, the LIVA imaging technique or the SOM technique, which cannot penetrate the layers of metals to detect the failure mode in the circuit.

In another more recently developed package for IC chips, i.e., the lead-on-chip (LOC) package, both the lead frame and the bounding wires are positioned on top of an IC circuit. The LOC package has been used in modem high density memory devices wherein a plurality of finger leads are disposed on and attached to an active surface of an IC chip. The benefits of using a LOC package is that the ratio between the size of an IC chip and the size of a package (which encapsulates the chip) is significantly higher than conventional packages since the mounting area (die pad) is no longer required in a LOC package. A high ratio between the chip size and the package size is very desirable in the ever increasing miniaturization of IC devices. A metal lead frame is normally used in a LOC package which substantially covers the active device.

Attempts have been made by others to perform failure analysis on the back surface of an IC chip package. For instance, the back surface of an IC chip package can be polished away to remove the encapsulating material and to expose the die back. A typical backside failure analysis conducted on an IC chip in an emission microscope is shown in FIG. 2. An emission microscope is an instrument that provides the location of localized light emissions in a field. The instrument is normally used for observing visible light emitted from voltage biased faulty semiconductor devices without the need for studying semiconductor materials directly. In order to examine the spectra distribution of the localized emissions and to determine the type of defects most likely caused the emission, a series of narrow band optical filters may be utilized in the light path of the microscope. The emission microscope is useful in studying the backside of an IC chip that is formed with multiple layers of conducting metals, such as in a transistor that is arranged under the multiple layers. In such a structure, it is difficult to detect emission from the front surface of the device and thus, necessitates the technique of backside failure analysis as shown in FIG. 2. By using an infrared light transmitted through the silicon layer of the IC device (which is transparent to IR), an observation from the backside of the IC is possible for failure site identification.

A problem in the test method shown in FIG. 2 is that the lead frame connecting the IC circuit can be easily damaged during the polishing process. A damaged lead frame cannot be electrically connected by soldering to a printed circuit board or by clamping to a test socket. As a consequence, a bias voltage which is required for performing the failure analysis cannot be applied to the circuit. The problem of making an electrical connection to the circuit to be tested therefore renders the performance of a failure analysis impossible.

It is therefore an object of the present invention to provide a method for backside failure analysis that requires simple bias conditions without the drawbacks or shortcomings of the conventional backside failure analysis methods.

It is another object of die present invention to provide a method for backside failure analysis that requires simple bias conditions that can be executed on the wafer scale without severing into individual dies.

It is a further object of the present invention to provide a method for backside failure analysis that requires simple bias conditions that can be used to analyze defective IC dies on a wafer without damaging other good dies.

It is another further object of the present invention to provide a method for backside failure analysis that requires simple bias conditions that does not require packaging steps to be performed in order to make electrical connections to the defective IC dies.

It is still another object of the present invention to provide a method for backside failure analysis that requires simple bias conditions by adhesively bonding conductive metal foils to the surface of the wafer and then wire bonding the foils to the bond pads on the defective IC die for feeding a bias voltage thereto.

It is yet another object of the present invention to provide a method for backside failure analysis that requires simple bias conditions that utilizes metal foils and wire bonds for feeding a bias voltage to a defective IC die and observing the defect from the backside of the wafer by infrared CCD.

It is still another further object of the present invention to provide a wafer sample for observing defects from a bottom surface of the wafer which includes at least two conductive metal strips adhesively bonded to the top surface of the wafer and at least two lead wires providing electrical communication between the conductive metal strips and bond pads on die defective IC die.

It is yet another further object of the present invention to provide a wafer specimen for observing defects from a backside of the wafer which includes a wafer that has at least one defective IC die in an active surface, at least two conductive strips made of metal foils adhesively bonded to the active surface of the wafer juxtaposed to the at least one defective IC die, and at least two lead wires electrically connecting the at least two conductive strips to the bond pads on the at least one defective IC die to provide a bias voltage to the die such that defects in the die can be observed in the wafer backside under IR CCD.

SUMMARY OF THE INVENTION

The present invention discloses a method for conducting backside failure analysis on a wafer that requires simple bias conditions and a wafer test specimen that can be analyzed by such method.

In a preferred embodiment, a method for conducting backside failure analysis on a wafer that requires simple bias conditions is provided which includes the steps of providing a wafer that has at least one defective IC die in an active surface, adhesively bonding at least two conductive metal strips on the active surface juxtaposed to the at least one defective IC die, wire bonding at least two lead wires for establishing electrical communication between the at least two conductive metal strips and the at least two bond pads, respectively, supplying a bias voltage to the at least one defective IC die through the at least two conductive metal strips, and observing a bottom side of the wafer for defects.

The method for conducting backside failure analysis on a wafer that requires simple bias conditions may further include the step of providing at least two conductive metal strips in metal foils of Al or Cu. The method may further include the step of providing the at least two lead wires in Au. The method may further include the step of providing the at least two lead wires in a length not longer than 15 mm, or in a length between about 5 mm and about 15 mm. The method may further include the step of adhesively bonding four conductive metal strips on the active surface with two strips each on the opposite sides of the at least one defective IC die.

The method for conducting backside failure analysis on a wafer that only requires simple bias conditions can be further executed by the additional step of supplying the at least two conductive metal strips in metal foils coated with an adhesive backing, the step of providing the at least two conductive metal strips in a width smaller than 5 mm. The method may further include the step of supplying a bias voltage for VCC or for clock signals. The method may further include the step of observing the wafer backside by an IR CCD. The method may further include the step of turning the wafer upside down and positioning the wafer on a sample holder.

The present invention is further directed to a wafer specimen for observing defects from a bottom surface of the wafer that includes a wafer that has at least one defective IC die in a top surface, at least two conductive metal strips adhesively bonded to the top surface of the wafer parallel to one side of the at least one defective IC die, and at least two lead wires providing electrical communication between the at least two conductive metal strips and a corresponding bond pad on the at least one defective IC die and for providing a bias voltage to the die such that defects in the die may be observed in a bottom surface.

In the wafer specimen for observing defects from a bottom surface of the wafer, the at least two lead wires are bonded to the at least two conductive metals and the corresponding bond pads by an wire bonding process. The at least two conductive metal strips are formed of metal foils of Al or Cu, the metal foils may have a width smaller than 5 mm. The at least two lead wires may have a length of not longer than 15 mm. The at least two conductive metal strips are metal foils coated with an adhesive backing. The wafer specimen may further include four conductive metal strips adhesively bonded to the top surface of the wafer parallel to two opposing sides of the at least one defective IC die.

In another preferred embodiment, the present invention provides a method for conducting failure analysis on a wafer backside that only requires simple bias conditions to be fed into at least one defective IC die which can be executed by the steps of first providing a wafer that has at least one defective IC die in a top surface, then bonding at least two adhesive backed conductive metal foils on the top surface juxtaposed to the at least one defective IC die, bonding at least two lead wires not longer than 15 mm for establishing electrical communication between the at least two conductive metal strips and the at least two bond pads in the active surface, respectively, feeding a bias voltage to the at least one defective IC die through the at last two conductive metal foils, turning the wafer upside down and positioning on a sample holder, and observing a bottom side of the wafer for defects by an optical detector. The method may further include the step of feeding the bias voltage of VCC or clock signals.

BRIEF DESCRIPTION OF THE DRAWINGS

These objects, features and advantages will become apparent by an examination of the following specification and the appended drawings in which.

DETAILED DESCRIPTION OF THE PREFERRED EMBODIMENT

Figure 1:
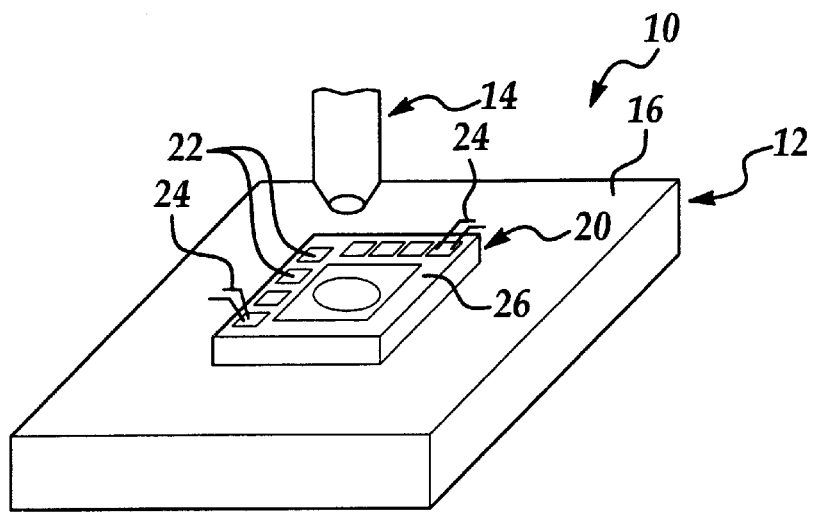
FIG. 1 is an illustration of a conventional test set up for failure analysis of an IC chip connected to a test circuit by bonding wires.
Figure 2:
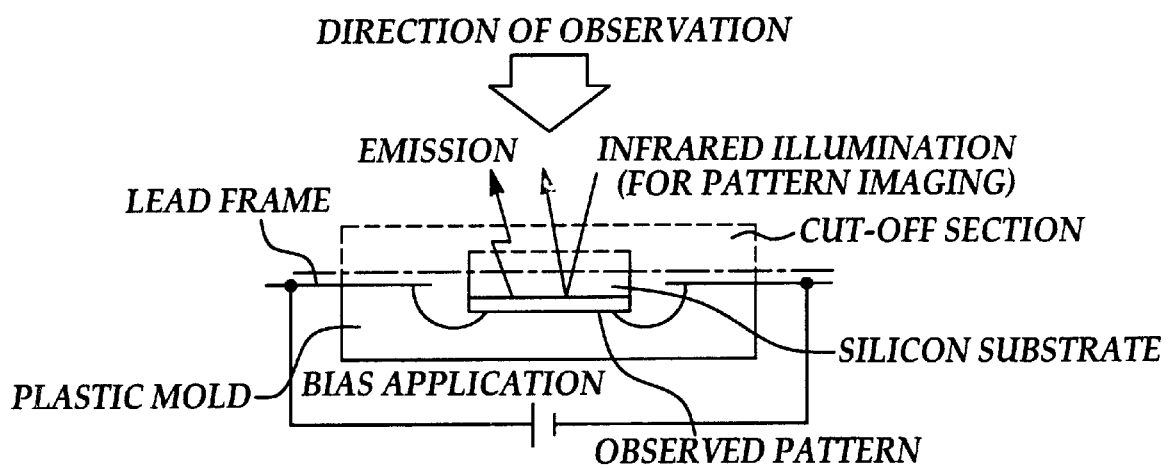
FIG. 2 is an illustration of a conventional test set up for failure analysis by an emission microscopic method on the backside of an IC device.

The present invention discloses a method for conducting backside failure analysis on a wafer that only requires simple bias conditions such as a simple bias voltage for VCC or clock signals for feeding into a defective IC die. The present invention novel method can be conducted on a wafer scale without first severing the IC dies into separate dies and without a packaging process to enable electrical connections to be made to the defective die. The present invention method can be executed on a wafer surface with simplicity and at low cost without damaging other good dies. Since the method allows testing on wafer without severing the wafer into dies, there is no need for scribing, packaging, grinding, polishing in order to make electrical connections to and to expose the backside of a defective IC die. Significant time saving and cost saving can be realized by utilizing the present invention novel test method. Furthermore, the present invention failure analysis method does not damage or otherwise disturb other good dies on the wafer being analyzed.

The present invention novel method can be simply executed by first providing a wafer that has at least one defective IC die in an active surface, then adhesively bonding at least two conductive metal strips made of metal foils on the active surface of the wafer juxtaposed to the at least one defective IC die, then wire bonding at least two lead wires for establishing electrical communication between the at least two conductive metal strips and at least two bond pads on the wafer surface, respectively, then supplying a bias voltage to the at least one defective IC die through the at least two conductive metal strips and observing a backside of the wafer for defects by an optical detector. A suitable optical detector to be used in the present invention novel method may be an IR CCD, an emission microscope, or a visible light CCD. The present invention novel test method may further be utilized in an optical beam induced current technique by using an IR laser, or in an optical beam induced resistance change technique by using an IR laser. While the present invention novel method can be used for any type of failure analysis technique, it is particularly suitable for techniques that only require simple bias conditions, for instance, those that require a simple bias voltage to be fed into a defective IC die. The simple bias voltage may be one suitable for VCC or for clock signals. The present invention novel method can be simply executed for sample preparation.

The present invention novel method provides several processing advantages including shortened sample preparation time, shortened sample analysis time and the capability of conducting multi-die analysis simultaneously without damaging other good dies. The present invention further provides the benefit of allowing a test to be conducted on wafer scale without the need of scribing the wafer into individual IC dies and packaging the IC dies for making electrical connection thereto. Complicated sample preparation steps that are normally required in a conventional test method which include scribing, packaging, opening the backside and polishing can be saved which result in significant time savings and cost savings.

The present invention is further directed to a wafer specimen that can be used for observing defects from a backside of the wafer. The wafer specimen is equipped with at least two conductive metal strips formed of thin metal foils that are adhesive backed and are bonded to the active (or front) surface of the wafer parallel to the defective IC die to be analyzed. The wafer specimen further includes bond wires that are connected by a wire bonding technique between the metal strips and the bond pads on the defective IC die such that a bias voltage can be fed into the die such that defects in the die can be observed in a backside. The metal strips glued on top of the wafer surface is electrically insulated from the wafer surface by the glue layer which covers the entire surface of the metal strip that faces the wafer surface. Electrical connections with the defective IC die is only established by lead wires connected in a wire bonding technique between the metal strips and selective bond pads on the defective IC die. The metal strips can be connected to as many defective IC dies as desired by making suitable lead wire connections during the wire bonding process.

Figure 3:
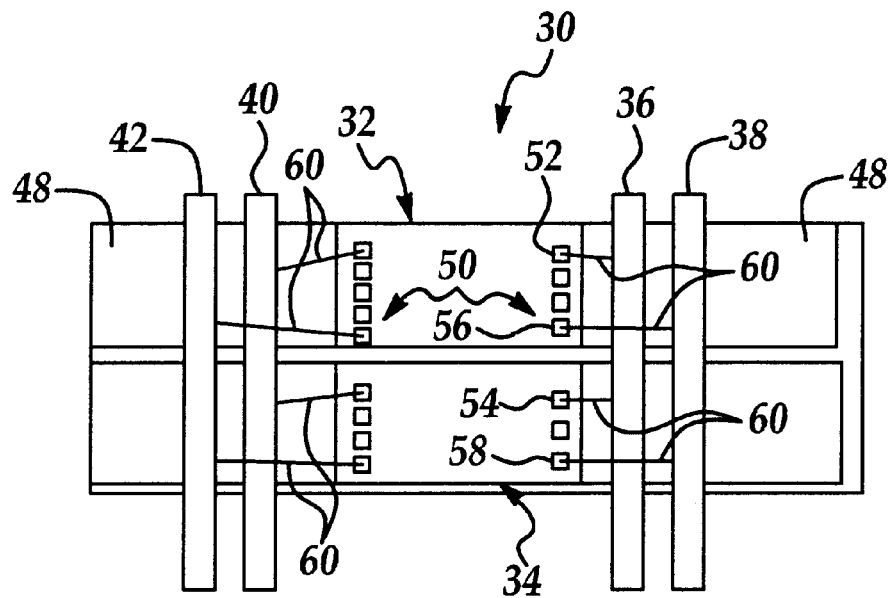
FIG. 3 is a plane view of the conventional method for feeding a simple bias voltage into defective IC dies situated on a wafer.

Referring now to FIG. 3, wherein a present invention novel test set-up 30 is shown in a plane view. The set-up 30 is a section of a wafer surface while the other sections and the entire wafer are not shown for simplicity reasons. The present invention novel method for testing a wafer backside for failure analysis of selective defective IC dies can be executed in the following manner. First, a wafer that contains defective IC die 32, 34 is provided. An electrically conductive metal foil that is formed in metal strips 36, 38, 40 and 42 are then glued onto a top (or active) surface 48 of the wafer by an adhesive means. A suitable adhesive means is a metal foil that is coated with an adhesive layer on the back of the foil and protected by a protective sheet of paper or plastic. When the paper or plastic protective sheet is peeled off, the strip of metal foil can be easily glued to the top surface 48 of the wafer by pressing onto the surface 48. The metal foil can be provided in a suitable thickness and width. For instance, a suitable thickness may be any thickness that is less than 1 mm, while a suitable width may be any width that is less than 5 mm.

The metal strips 36, 38, 40, 42 are utilized in a similar manner to bus bars for providing a voltage to the defective IC dies 32, 34 through bond pads 50. For instance, metal strip 36 may provide a positive voltage to bond pads 52, 54 while metal strip 38 may provide a negative voltage to bond pads 56, 58. Metal strips 40, 42 perform similar functions by connecting suitable bond pads 50 and providing bias voltages to the IC dies 32, 34. A suitable bias voltage provided to the defective dies 32, 34 may be any voltage such as VCC or clock signals. The electrical connections between the metal strips 36, 38 and the bond pads 50 can be accomplished in a wire bonding technique by using lead wires 60. The wire bonding technique utilized is similar to that used in wire bonding a lead frame to a bond pad. A suitable length for the lead wires 60 may be between about 5 mm and about 15 mm, and preferably between about 8 mm and about 10 mm. The lead wires can be suitably made of Au or Al as long as the bias voltage can be fed to the defective IC chips 32, 34 without high resistance.

The connections made by lead wires 60 between the metal strips 36, 38, 40, 42 and the bond pads 50 arc based on a bonding diagram for the IC circuit formed on the defective chips 32, 34. The bond pads 50 arranged on the defective IC dies 32, 34, can be either in an area array or in a peripheral array as long as the lead wires 60 required is not excessively long. This can be suitably arranged by positioning the metal strips 36, 38, 40 42 at locations juxtaposed to the bond pads.

Figure 4:
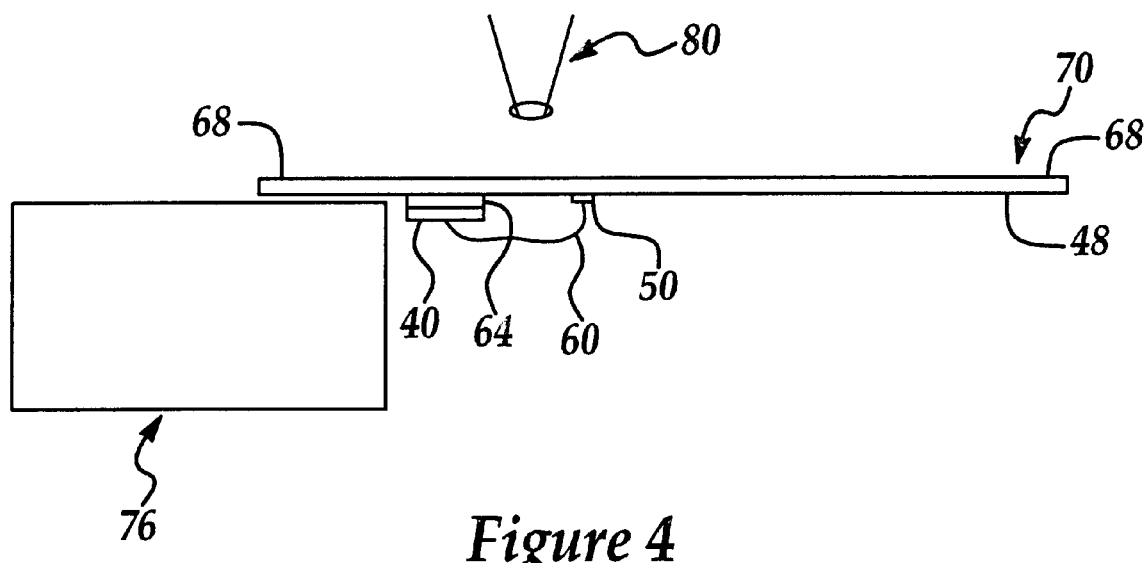
FIG. 4 is a side view of the present invention novel method of using metal foils and wire bonds for feeding a simple bias condition into a defective IC chip of FIG. 3.

FIG. 4 is an illustration of a side view of the present invention novel test set-up. A wafer 70 having a defective IC die (not shown) on top equipped with a bond pad 50 is provided. A metal strip 40 is glued to the top surface 48 of the wafer 70 by an adhesive layer 64. A lead wire 60 is then bonded by a wire bonding technique between the metal strip 40 and the bond pad 50 to provide an electrical connection to the defective IC die. After suitable connections are made between the metal strips and the bond pads, wafer 70 is turned upside down and mounted on a sample holder 76. The sample holder can be of any suitable shape or material. A simple sample holder can be a piece of wax. For a large wafer, a multiple number of sample holders 76 may be utilized. However, for simplicity reasons only one sample holder 76 is shown in FIG. 4.

After wafer 70 is turned upside down, as shown in FIG. 4, an optical detection device such as an IR CCD 80 may be used to detect defects on the backside 68 of wafer 70. An emission microscope can be similarly utilized for such observations. The lead wire 60 that provides electrical communication between the metal strip 40 and the bond pad 50 is held in a suspended manner (shown in FIG. 4) during the failure analysis. When an infrared detection device is used, since bare silicon that covers the backside 68 of the wafer 70 is transparent to infrared emission, i.e., the IR penetrates through the bare silicon layer, any defects contained in the defective IC die can be readily observed. For instance, a short in the circuit shows up as a bright spot in an IR CCD image, and similarly, in an emission microscopic image.

It should be noted that, when there are no metal layers in the IC die, the present invention novel method can also be utilized to observe the active side of the wafer, in addition to the backside of the wafer. The present invention novel method provides numerous processing and analytical advantages, i.e., it allows tests to be conducted on a complete wafer without the need of scribing and packaging resulting in time and cost savings. Secondly, the present invention novel test method can be conducted with shortened analysis time due to the ease of making electrical connections with a defective IC die. Thirdly, the present invention novel method enables a multi-die analysis simultaneously without causing any damages to die other good dies. The present invention novel method can therefore be advantageously used whenever a simple bias condition is required to be fed into a defective die for observation of failure sites or other failure conditions in the die.

The present invention novel test method and a wafer test specimen for performing such test have therefore been amply described in the above descriptions and in the appended drawings of FIGS. 3 and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for conducting backside failure analysis on a wafer that requires simple bias conditions comprising the steps of:

providing a wafer having at least one defective IC die in an active surface, adhesively bonding at least two conductive metal strips on said active surface juxtaposed to said at least one defective IC die, wire bonding at least two lead wires for establishing electrical communication between said at least two conductive metal strips and at least two bond pads, respectively, supplying a bias voltage to said at least one defective IC die through said at least two conductive metal strips, and observing a backside of said wafer for defects.

2. A method for conducting backside failure analysis on a wafer that requires simple bias conditions according to claim 1 further comprising the step of providing at least two conductive metal strips in metal foils of Al or Cu.

3. A method for conducting backside failure analysis on a wafer that requires simple bias conditions according to claim 1 further comprising the step of providing said at least two lead wires in Au.

4. A method for conducting backside failure analysis on a wafer that requires simple bias conditions according to claim 1 further comprising the step of providing said at least two lead wires in a length not longer than 15 mm.

5. A method for conducting backside failure analysis on a wafer that requires simple bias conditions according to claim 1 further comprising the step of providing said at least two lead wires in a length between about 5 mm and about 15 mm.

6. A method for conducting backside failure analysis on a wafer that requires simple bias conditions according to claim 1 further comprising the step of adhesively bonding four conductive metal strips on said top surface with two strips each on the opposite sides of said at least one defective IC die.

7. A method for conducting backside failure analysis on a wafer that requires simple bias conditions according to claim 1 further comprising the step of supplying said at least two conductive metal strips in metal foils coated with an adhesive backing.

8. A method for conducting backside failure analysis on a wafer that requires simple bias conditions according to claim 1 further comprising the step of providing said at least two conductive metal strips in a width smaller than 5 mm.

9. A method for conducting backside failure analysis on a wafer that requires simple bias conditions according to claim 1 further comprising the step of supplying a bias voltage for VCC or for clock signals.

10. A method for conducting backside failure analysis on a wafer that requires simple bias conditions according to claim 1 further comprising the step of observing said backside of wafer by an IR CCD.

11. A method for conducting backside failure analysis on a wafer that requires simple bias conditions according to claim 1 further comprising the step of turning said wafer upside down and positioning said wafer on a sample bolder.

12. A wafer specimen for observing defects on a backside of the wafer comprising:

a wafer having at least one defective IC die in an active surface, at least two conductive metal strips adhesively bonded to said active surface of the wafer parallel to one side of said at least one defective IC die, and at least two lead wires for providing electrical communication between said at least two conductive metal strips and a corresponding bond pad on said at least one defective IC die and for providing a bias voltage to said die such that defects in said die observed in a backside.

13. A wafer specimen for observing defects from a backside of the wafer according to claim 12, wherein said at least two lead wires are bonded to said at least two conductive metal strips and said corresponding bond pads by a wire bonding technique.

14. A wafer specimen for observing defects from a backside of the wafer according to claim 12, wherein said at least two conductive metal strips arc formed of metal foils of Al or Cu.

15. A wafer specimen for observing defects from a backside of the wafer according to claim 12, wherein said at least two conductive metal strips are formed of metal foils having a width smaller than 5 mm.

16. A wafer specimen for observing defects from a backside of the wafer according to claim 12, wherein said at least two lead wires having a length not longer than 15 mm.

17. A wafer specimen for observing defects from a backside of the wafer according to claim 12, wherein said at least two conductive metal strips are metal foils coated with an adhesive backing.

18. A wafer specimen for observing defects from a backside of the wafer according to claim 12 further comprising four conductive metal strips adhesively bonded to said active surface of the wafer parallel to two opposing sides of said at least one defective IC die.

19. A method for conducting failure analysis on a wafer backside that requires simple bias conditions comprising the steps of:

providing a wafer having at least one defective IC die in a top surface, bonding at least two adhesive boned conductive metal foils on said top surface juxtaposed to said at least one defective IC die, bonding at least two lead wires not longer than 15 mm for establishing electrical communication between said at least two conductive metal strips and at least two bond pads on said top surface, respectively feeding a bias voltage to said at least one defective IC diet through said at least two conductive metal foils, turning said wafer upside down and positioning on a sample holder, and observing a backside of said wafer for defects by an optical detector.

20. A method for conducting failure analysis on a wafer backside that requires simple bias conditions according to claim 19 further comprising the step of feeding said bias voltage of VCC or clock signals.

* * * * *